United States Patent
Kim et al.

(10) Patent No.: US 7,560,760 B2
(45) Date of Patent: *Jul. 14, 2009

(54) FERROELECTRIC MEMORY DEVICES HAVING EXPANDED PLATE LINES

(75) Inventors: Hyun-Ho Kim, Kyunggi-do (KR);
Dong-Jin Jung, Kyunggi-do (KR);
Ki-Nam Kim, Kyunggi-do (KR);
Sang-Don Nam, Seoul (KR);
Kyu-Mann Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/859,958

(22) Filed: Sep. 24, 2007

(65) Prior Publication Data

US 2008/0025065 A1    Jan. 31, 2008

Related U.S. Application Data

(63) Continuation of application No. 10/948,610, filed on Sep. 23, 2004, now Pat. No. 7,285,810, which is a continuation of application No. 10/136,991, filed on May 2, 2002, now Pat. No. 6,844,583.

(30) Foreign Application Priority Data

Jun. 26, 2001  (KR) ............................... 2001-36624
Feb. 4, 2002   (KR) ............................... 2002-06192

(51) Int. Cl.
*H01L 27/115* (2006.01)

(52) U.S. Cl. ............... 257/298; 257/295; 257/E21.664; 257/E27.104; 438/3

(58) Field of Classification Search ................. 257/532, 257/295, E27.104, E21.664
See application file for complete search history.

(56) References Cited

U.S. PATENT DOCUMENTS 5,350,705 A * 9/1994 Brassington et al. ........ 257/295

(Continued)

FOREIGN PATENT DOCUMENTS

JP      10-056143      2/1998

(Continued)

*Primary Examiner*—Jerome Jackson, Jr.
*Assistant Examiner*—Paul A Budd
(74) *Attorney, Agent, or Firm*—Myers Bigel Sibley & Sajovec, P.A.

(57) ABSTRACT

A ferroelectric memory device includes a microelectronic substrate and a plurality of ferroelectric capacitors on the substrate, arranged as a plurality of row and columns in respective row and column directions. A plurality of parallel plate lines overlie the ferroelectric capacitors and extend along the row direction, wherein a plate line contacts ferroelectric capacitors in at least two adjacent rows. The plurality of plate lines may include a plurality of local plate lines, and the ferroelectric memory device may further include an insulating layer disposed on the local plate lines and a plurality of main plate lines disposed on the insulating layer and contacting the local plate lines through openings in the insulating layer. In some embodiments, ferroelectric capacitors in adjacent rows share a common upper electrode, and respective ones of the local plate lines are disposed on respective ones of the common upper electrodes. Ferroelectric capacitors in adjacent rows may share a common ferroelectric dielectric region. Related fabrication methods are discussed.

12 Claims, 21 Drawing Sheets

U.S. PATENT DOCUMENTS

| | | | |
|---|---|---|---|
| 5,959,878 A * | 9/1999 | Kamp | 365/117 |
| 5,959,879 A | 9/1999 | Koo | |
| 5,986,301 A * | 11/1999 | Fukushima et al. | 257/306 |
| 6,004,839 A | 12/1999 | Hayashi et al. | |
| 6,090,697 A * | 7/2000 | Xing et al. | 438/618 |
| 6,094,370 A | 7/2000 | Takashima | |
| 6,235,573 B1 | 5/2001 | Lee et al. | |
| 6,249,014 B1 | 6/2001 | Bailey | |
| 6,256,220 B1 * | 7/2001 | Kamp | 365/145 |
| 6,300,654 B1 * | 10/2001 | Corvasce et al. | 257/296 |
| 6,310,374 B1 | 10/2001 | Satoh et al. | |
| 6,410,397 B1 | 6/2002 | Ochiai et al. | |
| 6,521,929 B2 * | 2/2003 | Ozaki | 257/295 |
| 6,521,937 B1 * | 2/2003 | Miyato | 257/303 |
| 6,560,137 B2 * | 5/2003 | Allen et al. | 365/145 |
| 6,576,941 B1 * | 6/2003 | Lee et al. | 257/295 |
| 6,593,613 B1 * | 7/2003 | Alsmeier et al. | 257/306 |
| 6,657,883 B2 * | 12/2003 | Takashima | 365/145 |
| 6,844,583 B2 * | 1/2005 | Kim et al. | 257/306 |
| 6,872,996 B2 * | 3/2005 | Demange et al. | 257/295 |
| 6,887,720 B2 * | 5/2005 | Joo | 438/3 |
| 6,909,134 B2 * | 6/2005 | Song et al. | 257/296 |
| 6,979,881 B2 * | 12/2005 | Joo et al. | 257/532 |
| 2002/0127867 A1 | 9/2002 | Lee | |
| 2004/0228176 A1 * | 11/2004 | Fujisawa et al. | 365/158 |

FOREIGN PATENT DOCUMENTS

| | | |
|---|---|---|
| JP | 2000-124409 | 4/2000 |
| JP | 2001-085632 | 3/2001 |

* cited by examiner

US 7,560,760 B2

FERROELECTRIC MEMORY DEVICES HAVING EXPANDED PLATE LINES

RELATED APPLICATIONS

The present application is a continuation of U.S. patent application Ser. No. 10/948,610, filed Sep. 23, 2004, now U.S. Pat. No. 7,285,810 which is a continuation of U.S. patent application Ser. No. 10/136,991, filed May 2, 2002, now U.S. Pat. No. 6,844,583, the disclosures of which are hereby incorporated herein by reference. U.S. patent application Ser. No. 10/136,991 claims the benefit of Korean Patent Application No. 2001-36624, filed on Jun. 26, 2001, and Korean Patent Application No. 2002-06192 filed on Feb. 4, 2002.

BACKGROUND OF THE INVENTION

The present invention relates to memory devices and methods of fabrication therefor, and more particularly, to ferroelectric memory devices and methods of fabrication therefor.

Typical ferroelectric memory devices can retain data even when de-energized. Similar to DRAMs and SRAMs, ferroelectric memory devices typically operate with a low power supply voltage. Thus, ferroelectric devices are attractive for use in smart cards or the like.

A conventional method of fabricating a ferroelectric memory device will be described with reference to FIG. 1 through FIG. 3. Referring now to FIG. 1, a device isolation layer 13 is formed in a predetermined area of a semiconductor substrate 11 to define an active region. A plurality of insulated gate electrodes 15, i.e., local word lines, is formed across the active region and the device isolation layer 13. Thereafter, impurities are implanted into the active region between the gate electrodes 15 to form source/drain regions 17s and 17d. A first lower interlayer insulating layer 19 is formed on the resultant structure. The first lower interlayer insulating layer 19 is patterned to form storage node contact holes that expose the source regions 17s. Contact plugs 21 are then formed in the storage node contact holes.

Referring to FIG. 2, ferroelectric capacitors 32 are arrayed on the contact plugs 21. Each of the ferroelectric capacitors 32 is composed of a bottom electrode 27, a ferroelectric layer 29, and a top electrode 31. Each of the bottom electrodes 27 covers a respective contact plug 21. A first upper interlayer insulating layer 33 is formed on the ferroelectric capacitors 32. A plurality of main word lines 35, which are local gate lines 15, are then formed on the first upper interlayer insulating layer 33. Each of the main word lines 35 generally controls four local word lines 15.

Referring now to FIG. 3, a second upper interlayer insulating layer 37 is formed on the main word lines 35. The second and first interlayer insulating layers 37 and 33 are patterned to form via holes 39 that expose the top electrodes 31. A plurality of plate lines 41 are formed that contact the top electrodes 31 through the via holes 39. The plate lines 41 are arranged to be parallel with the word lines 35.

To reduce an aspect ratio of each of the via holes 39, wet and dry etch techniques can be used. In this case, the via hole 39 tends to have an inclined upper sidewall 39a, as shown in FIG. 3. Unfortunately, excessive wet-etch may result in exposure of the main word lines 35.

As another approach to reduce an aspect ratio of the via hole 39, the diameter of the via hole 39 can be increased. However, a spacing between the via hole 39 and an adjacent main word line 35 tends to decrease with an increase in integration level. This makes precise alignment during a photo process for forming the via hole 39 desirable.

According to the foregoing prior art, decreasing an aspect ratio of the via holes leads to a strong probability that the main word lines will be exposed. Therefore, it is hard to avoid an electric short between the plate line and the main word line as well as a contact failure between the top electrode and the plate line.

SUMMARY OF THE INVENTION

According to some embodiments of the present invention, a ferroelectric memory device includes a microelectronic substrate and a plurality of ferroelectric capacitors on the substrate, arranged as a plurality of row and columns in respective row and column directions. A plurality of parallel plate lines overlie the ferroelectric capacitors and extend along the row direction, wherein a plate line contacts ferroelectric capacitors in at least two adjacent rows. In some embodiments, the ferroelectric capacitors include an upper electrode, and the plurality of plate lines includes a plurality of local plate lines that contact the upper electrodes of the ferroelectric capacitors. The plurality of plate lines may include a plurality of local plate lines, and the ferroelectric memory device may further include an insulating layer disposed on the local plate lines and a plurality of main plate lines disposed on the insulating layer and contacting the local plate lines through openings in the insulating layer. In some embodiments, ferroelectric capacitors in adjacent rows share a common upper electrode, and respective ones of the local plate lines are disposed on respective ones of the common upper electrodes. Ferroelectric capacitors in adjacent rows may share a common ferroelectric dielectric region.

According to other embodiments of the present invention, a ferroelectric memory device is fabricated. A plurality of ferroelectric capacitors is formed on a microelectronic substrate, the plurality of ferroelectric capacitors arranged as a plurality of row and columns in respective row and column directions. A plurality of parallel plate lines are formed on the substrate, overlying the ferroelectric capacitors and extending along the row direction, wherein a plate line contacts ferroelectric capacitors in at least two adjacent rows. The plate lines may include local plate lines. An insulating layer may be formed on the plate lines, and a plurality of main plate lines may be formed on the insulating layer, respective ones of which contact respective ones of the local plate lines through openings in the insulating layer.

DETAILED DESCRIPTION

Figure 1:
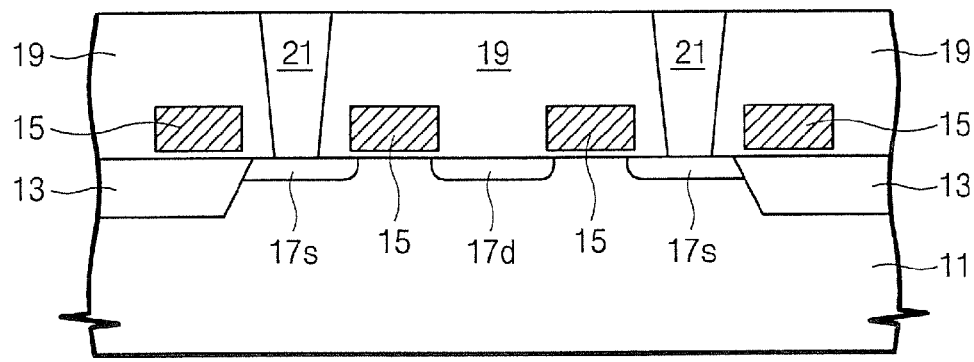
FIGS. 1-3 are cross-sectional views illustrating a conventional process for fabricating a ferroelectric memory device.
Figure 2:
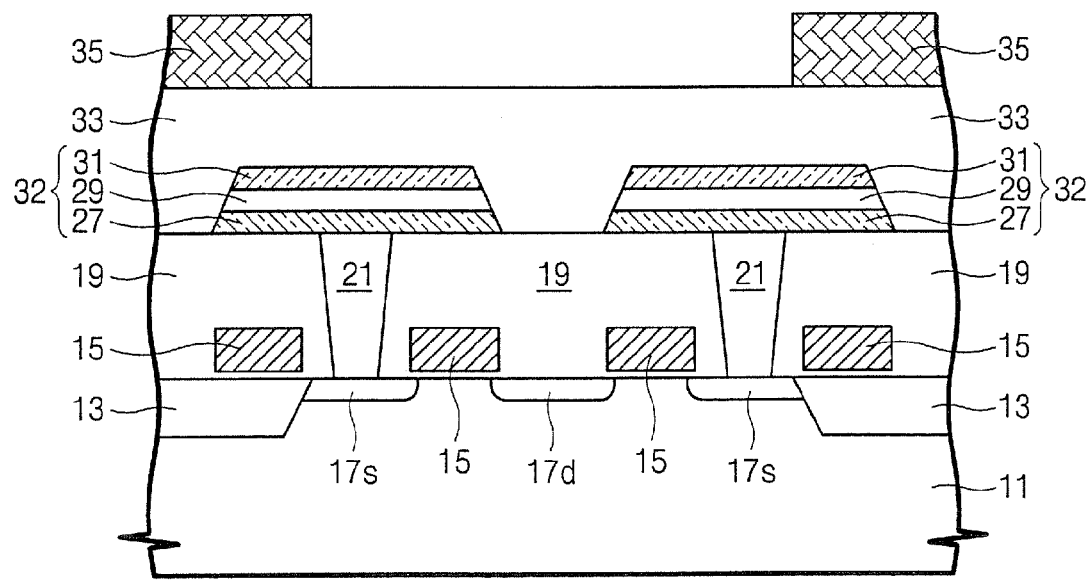

The present invention will now be described more fully hereinafter with reference to the accompanying drawings, in which typical embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 4:
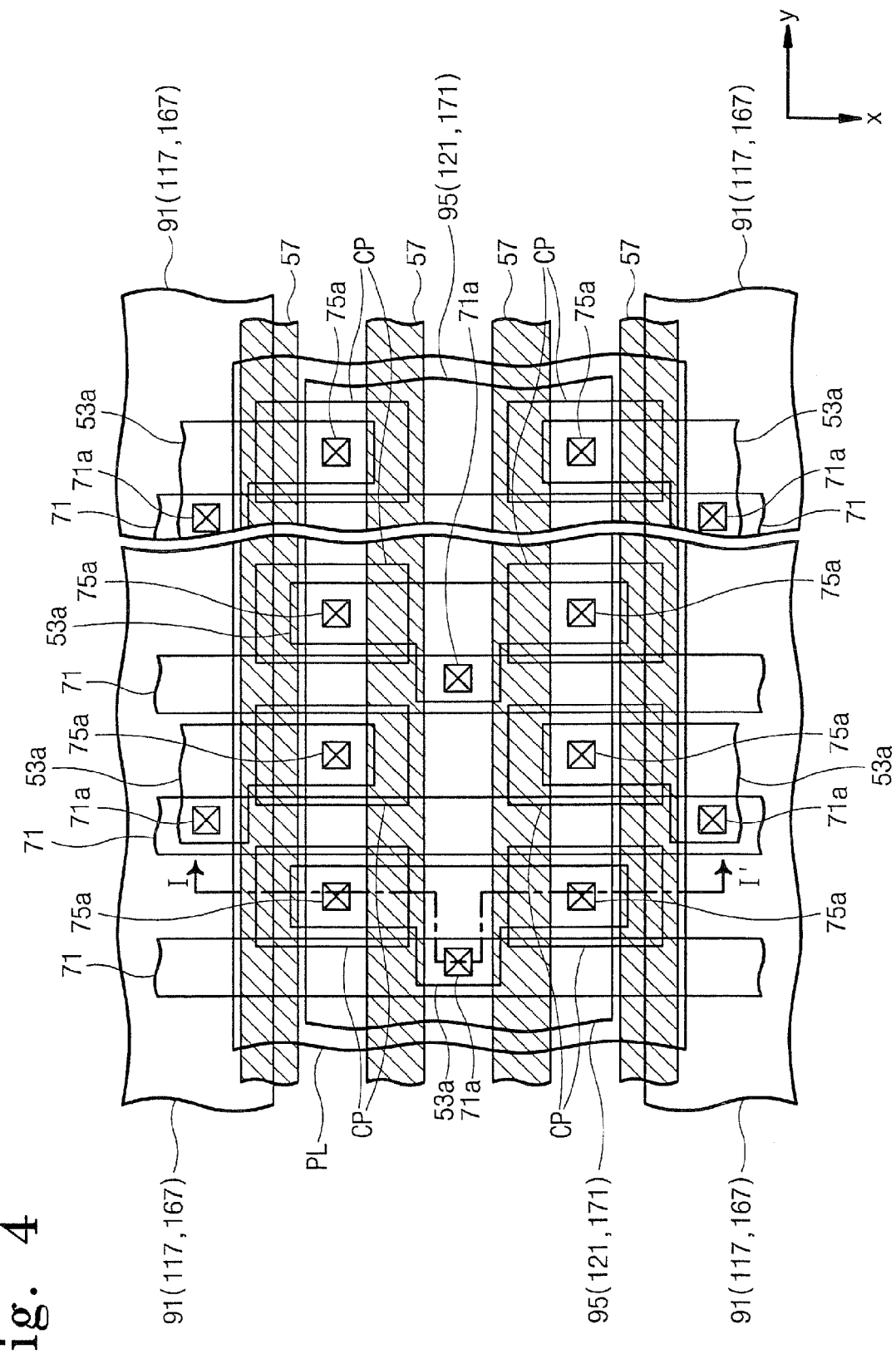
FIG. 4 is a top plan view of a ferroelectric memory device according to embodiments of the present invention.
Figure 5:
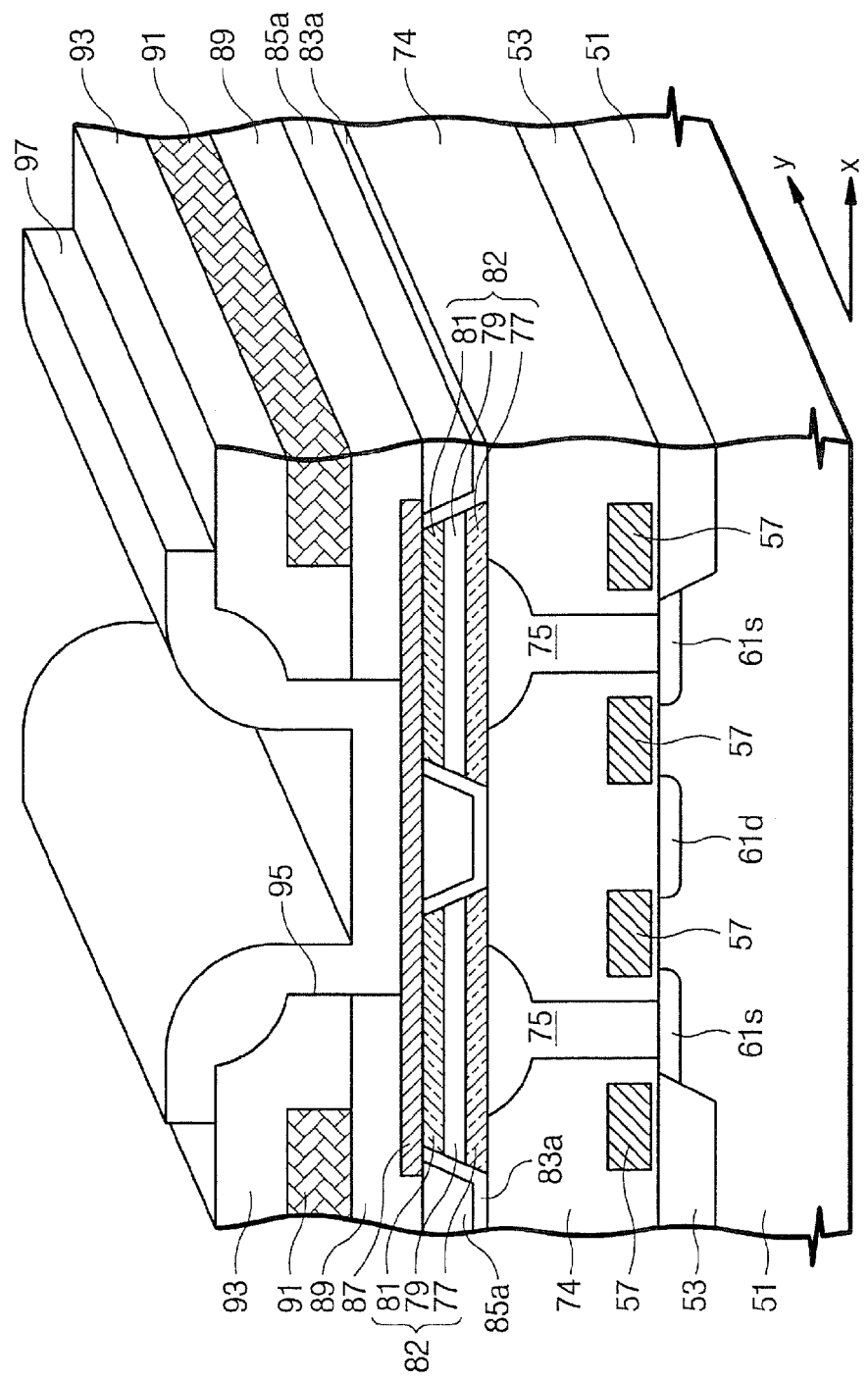
FIG. 5 is a perspective view illustrating a ferroelectric memory device according to some embodiments of the present invention.

Referring now to FIG. 4 and FIG. 5, a device isolation layer 53 is located at a predetermined area of a semiconductor substrate 51 to define a plurality of active regions 53a. A plurality of insulated gate electrodes 57 (i.e., a plurality of word lines) are arranged across the active regions 53a and the device isolation layer 53. The gate electrodes 57 are parallel and extend along a row direction (y-axis). Each of the active regions 53a intersects a couple of gate electrodes 57 to divide each of the active regions 53a into three parts. A common drain region 61d is formed at an active region 53a between the pair of the gate electrodes 57. Source regions 61s are formed at active regions 53a that are located at both sides of the common drain region 61d. Cell transistors are formed at points where the gate electrodes 57 intersect the active regions 53a. The cell transistors are arrayed along a column direction (x-axis) and the row direction (y-axis).

The cell transistors are covered with a lower interlayer insulating layer 74. A plurality of bit lines 71 are arranged in the lower interlayer insulating layer 74, transverse to the word lines 57. The bit lines 71 are electrically connected to the common drain regions 61d through bit line contact holes 71a. The source regions 61s are exposed by storage node contact holes 75a that penetrate the lower interlayer insulating layer 74. Preferably, an upper sidewall of the storage node contact hole 75a has a sloped profile. Each of the storage node contact holes 75a is filled with contact plugs 75. An upper diameter of the contact plug 75 is larger than a lower diameter thereof, as shown in FIG. 5.

A plurality of ferroelectric capacitors 82 (CP shown in FIG. 4) are arrayed along the column direction (x-axis) and the row direction (y-axis). Each of the ferroelectric capacitors 32 includes a bottom electrode 77, a ferroelectric layer pattern 79, and a top electrode 81. Respective ones of the bottom electrodes 77 are located on respective ones of the contact plugs 75. As a result, the bottom electrodes 77 are electrically connected to the source regions 61s through the contact plugs 75. Preferably, gaps between the ferroelectric capacitors 82 are filled with insulating layer patterns 85a.

Preferably, a hydrogen barrier layer pattern 83a is disposed between the insulating layer pattern 85a and the ferroelectric capacitors 82. Preferably, the hydrogen barrier layer pattern 83a is made of titanium oxide ($TiO_2$), aluminum oxide ($Al_2O_3$), silicon nitride ($Si_3N_4$), or a combination thereof. This makes it possible to prevent hydrogen atoms from penetrating into the ferroelectric layer pattern 79. If hydrogen atoms are implanted into the ferroelectric pattern 79, a reliability of the ferroelectric pattern 79 may be degraded. For example, if hydrogen atoms are injected into a ferroelectric layer such as PZT (Pb, Zr, $TiO_3$) layer, oxygen atoms in the PZT layer may react with the hydrogen atoms to cause an oxygen vacancy therein. Owing to the oxygen vacancy, a polarization characteristic of the ferroelectric layer may deteriorate and cause malfunction. If hydrogen atoms are captured in interface traps between the ferroelectric layer pattern and top/bottom electrodes, an energy barrier therebetween may be lowered. Accordingly, leakage current characteristics of the ferroelectric capacitors may be deteriorated.

A plurality of local plate lines 87 (PL shown in FIG. 4) are arranged on the ferroelectric capacitors 82 and the insulating layer pattern 85a. The local plate lines 87 extend along the row direction (y-axis). A respective one of the local plate lines 87 covers a respective pair of adjacent rows of ferroelectric capacitors 82. The local plate line 87 directly contacts with the top electrodes 81 of the underlying adjacent rows of capacitors 82. The local plate lines 87 are covered with an upper interlayer insulating layer. The upper interlayer insulating layer may include first and second upper interlayer insulating layers 89 and 93.

Figure 3:
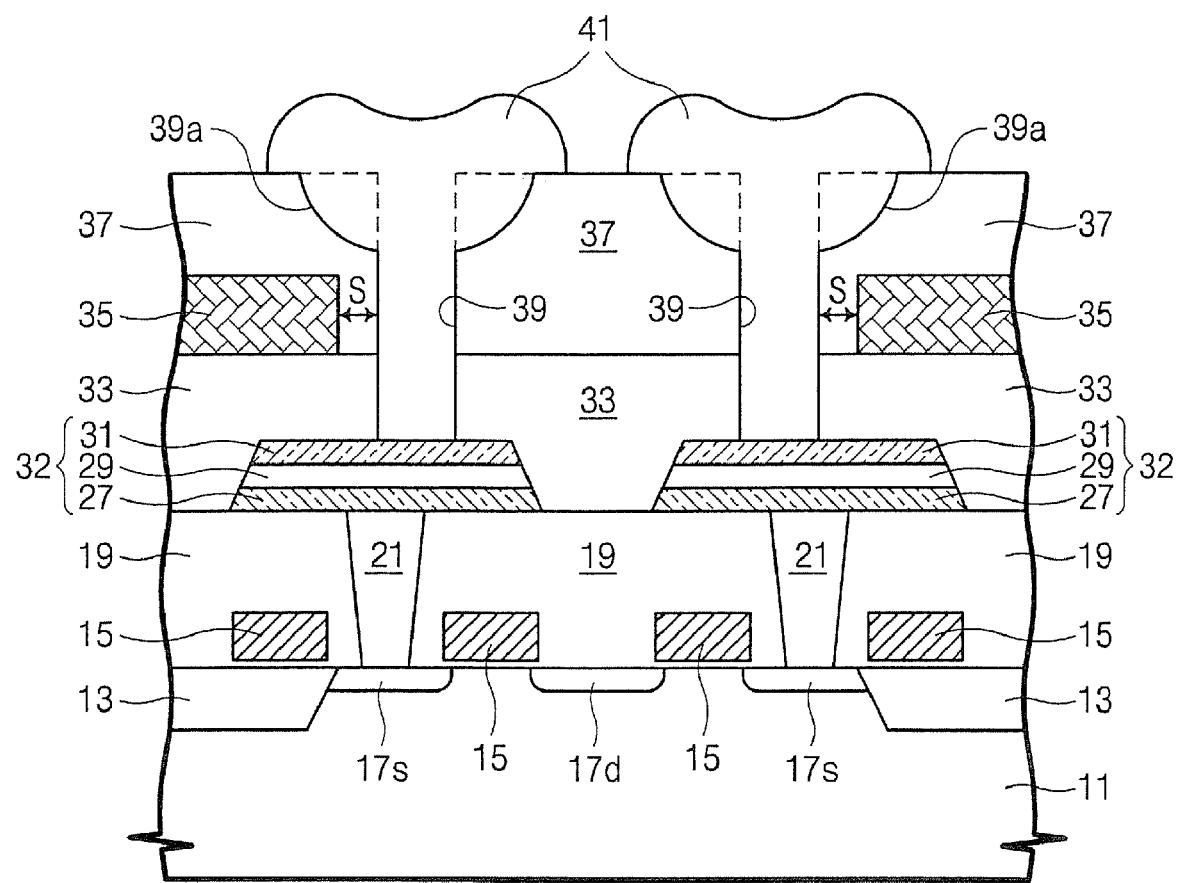

A plurality of main word lines 91 may be disposed between the first and second upper interlayer insulating layers 89 and 93. Generally, each of the main word lines 91 controls four word lines 57 using a decoder. A main plate line 97 may be arranged in the upper interlayer insulating layer between the main word lines 91. The main plate lines 97 are electrically connected to the local plate lines 87 through a slit-type via hole 95 penetrating the upper interlayer insulating layer. The slit-type via hole 95 extends in parallel along the row direction (y-axis). A width of the slit-type via hole 95 is larger than a diameter of the via hole (39 of FIG. 3) of the prior art. The local plate line 87 directly contacts the upper surfaces of the top electrodes 81.

In some embodiments, a plate line may be composed of the local plate line 87 and the main plate line 97. In other embodiments, the plate line may be composed of only the local plate line 87 or only the main plate line 97. Particularly, if the plate line is composed of only the main plate line 97, the insulating layer pattern 85a is preferably made of material having an etch selectivity with respect to the upper interlayer insulating layer. For example, if the upper interlayer insulating layer is made of silicon oxide, the insulating pattern 85a is preferably made of silicon nitride.

Figure 6:
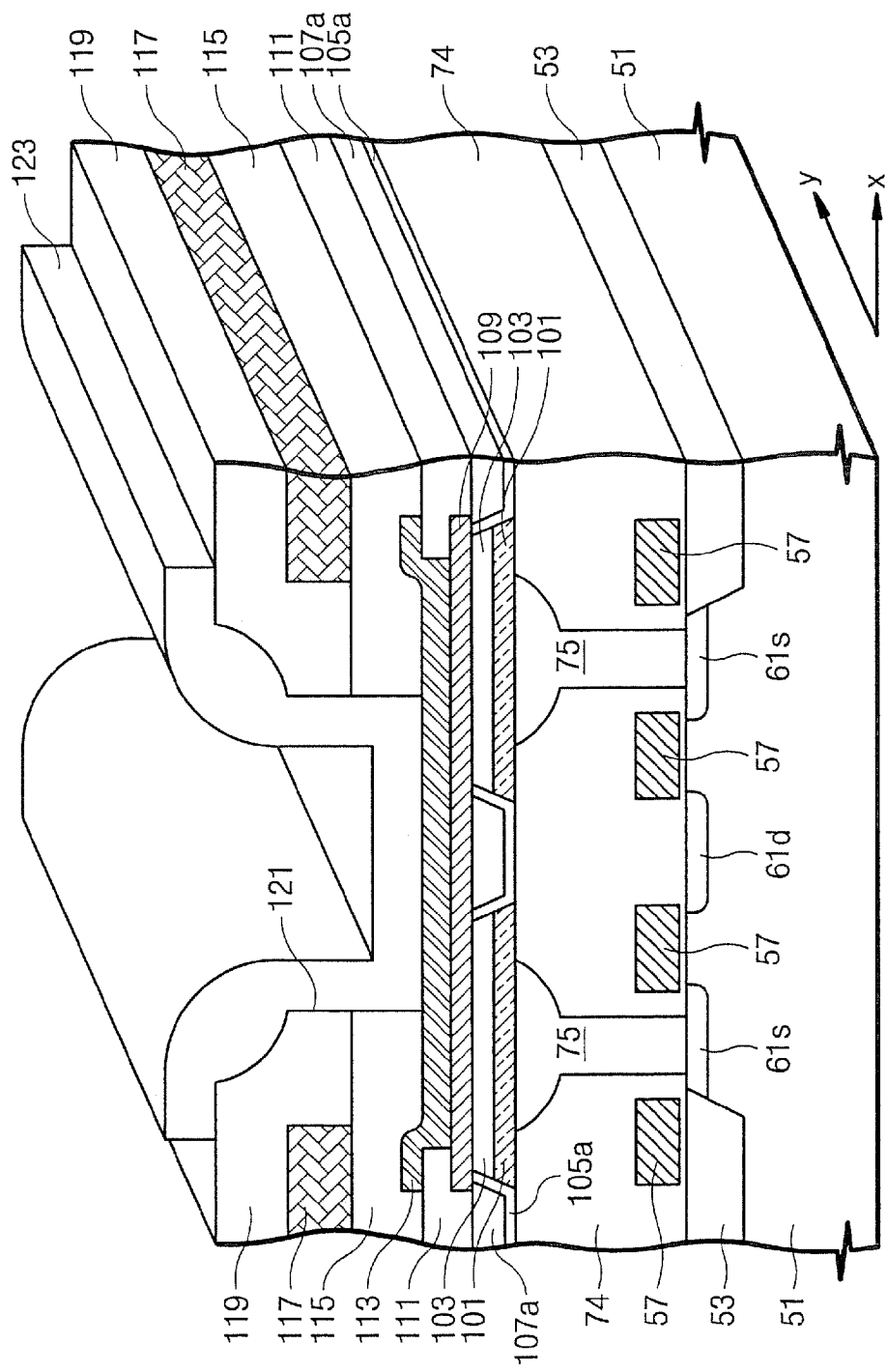
FIG. 6 is a perspective view illustrating a ferroelectric memory device according to further embodiments of the present invention.

A ferroelectric memory device according to second embodiments of the invention is shown in FIG. 6. In these embodiments, cell transistors, a lower interlayer insulating layer, and contact plugs have the same configuration as those in the embodiments of FIG. 5. Further description of these components is therefore omitted in light of the foregoing description.

Referring to FIG. 4 and FIG. 6, a plurality of ferroelectric capacitors covering the contact plugs 75 are located on the lower interlayer insulating layer 74. Therefore, the ferroelectric capacitors are 2-dimensionally arranged along the row and column directions. Each of the ferroelectric capacitors includes a bottom electrode 101, a ferroelectric layer pattern 103, and a common top electrode 109. The common top electrode 109 is extended to cover ferroelectric layer patterns 103 in adjacent rows. The common top electrode 109 extends along the row direction, similar to the local plate line PL shown in FIG. 4. Preferably, gaps between the ferroelectric patterns 103 and between the bottom electrodes 101 are filled with an insulating layer pattern 107a. Preferably, a hydrogen barrier layer pattern 105a is disposed between the lower insulating layer pattern 107a and at least the ferroelectric layer pattern 103.

The common top electrode 109 is covered with an upper insulating layer 111. The upper insulating layer 111 has a slit-type contact hole that exposes the common top electrode 109. The slit-type contact hole extends along the row direction (y-axis) and is covered with a local plate line 113 (PL shown in FIG. 4). The local plate line 113 is electrically connected to the common top electrode 109 through the slit-type contact hole. The local plate line 113 is covered with an upper interlayer insulating layer including first and second upper interlayer insulating layers 115 and 119.

A plurality of main word lines 117 may be disposed between the first and second upper interlayer insulating layers 115 and 119. The main word lines 117 extend in parallel along the row direction. A main plate line 123 may be located in the upper interlayer insulating layer between the main word lines 117. The main plate line 123 is electrically connected to the local plate line 113 through a slit-type via hole 121 that penetrates the upper interlayer insulating layer. The slit-type via hole 121 extends along the row direction (y-axis).

A plate line includes the local plate line 113 and the main plate line 123. Alternatively, the plate line may consist of only the local plate line 113 or only the main plate line 123.

Figure 7:
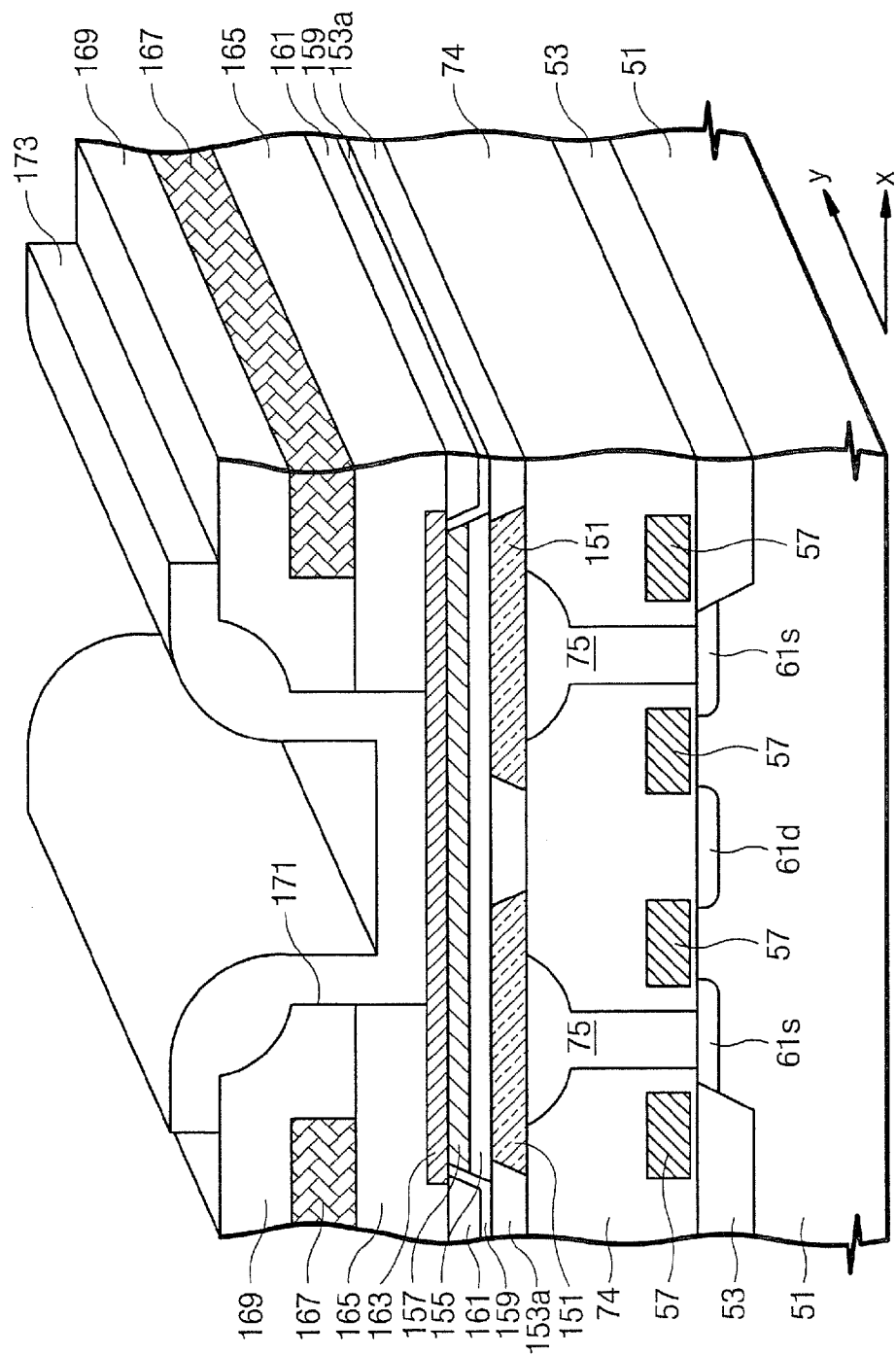
FIG. 7 is a perspective view illustrating a ferroelectric memory device according to still other embodiments of the present invention.

A ferroelectric memory device according to third embodiments of the invention is shown in FIG. 7. In these embodiments, cell transistors, a lower interlayer insulating layer, and contact plugs have the same configuration as those in the embodiments of FIG. 5. Further description of these components will therefore be omitted in light of the foregoing description.

Referring to FIG. 4 and FIG. 7, a plurality of ferroelectric capacitors covering respective ones of the contact pugs 75 is arranged on the lower interlayer insulating layer 74, such that the ferroelectric capacitors are arrayed along row and column directions. Each of the ferroelectric capacitors includes a bottom electrode 151, a common ferroelectric layer pattern 155, and a common top electrode 157. The common ferroelectric pattern 155 is extended to cover the bottom electrodes 151 of at least two adjacent rows. The common top electrode 157 is stacked on the common ferroelectric layer pattern 155. Therefore, the common ferroelectric pattern 155 and the common top electrode 157 extend along the row direction, similar to the local plates line PL shown in FIG. 4.

Preferably, a gap area between the bottom electrodes 151 is filled with a lower insulating layer pattern 153a, and gap areas between the common ferroelectric layer patterns 155 and between the common top electrodes 157 are filled with a top insulating layer pattern 161. A hydrogen barrier layer pattern 159 may be disposed between the top insulating layer pattern 161 and at least the common ferroelectric layer pattern 155.

A local plate line 163 (e.g., corresponding to the plate line PL shown in FIG. 4) is located on the common top electrode 157. The local plate line 163 extends in the row direction. The local plate line 163 is covered with an upper interlayer insulating layer, which includes first and second upper interlayer insulating layers 165 and 169.

A plurality of main word lines 167 may be disposed between the first and second upper interlayer insulating layers 165 and 169. The main word lines 167 extend in parallel along the row direction. A main plate line 173 may be disposed in the upper interlayer insulating layer between the main word lines 167. The main plate line 173 is electrically connected to the local plate line 163 through a slit-type via hole 171 that penetrates the upper interlayer insulating layer. The slit-type via hole 171 extends along the row direction (y-axis).

A plate line includes the local plate line 163 and the main plate line 173. Alternatively, the plate line may consist of only the local plate line 163 or only the main plate line 173.

A method of fabricating a ferroelectric memory device according to some embodiments of the present invention will now be described more fully hereinafter with reference to FIG. 8 through FIG. 14.

Figure 8:
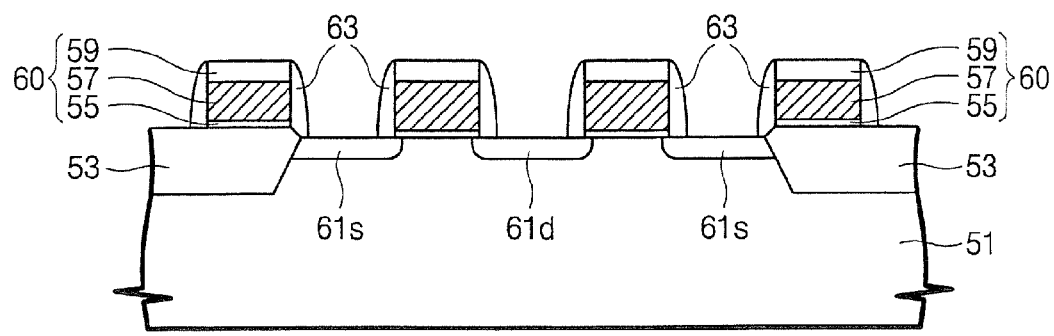
FIGS. 8-14 are cross-sectional views of intermediate fabrication products illustrating operations for fabricating a ferroelectric memory device according to some embodiments of the present invention.

Referring now to FIG. 8, a device isolation layer 53 is formed in a predetermined area of a semiconductor substrate 51 to define a plurality of active regions 53a. A gate insulating layer, a gate conductive layer, and a capping insulating layer are sequentially formed on the semiconductor substrate 51. The capping insulating layer, the gate conductive layer, and the gate insulating layer are successively patterned to form a plurality of gate patterns 60 crossing over the active regions and the device isolation layer 53. Each of the gate patterns 57 includes a gate insulating layer pattern 55, a gate electrode 57, and a capping insulating layer pattern 59.

Using the gate patterns 60 and the device isolation layer 53 as ion implantation masks, impurities are implanted into the active regions to form three impurity regions in each of the active regions. A central impurity region corresponds to a common drain region 61d, and the other regions correspond to source regions 61s. Therefore, a couple of cell transistors are formed in each of the active regions. The cell transistors are arrayed on the semiconductor substrate 51 along row and column directions. Then, a spacer 63 is formed on a sidewall of the gate pattern 60 using, for example, conventional processes.

Figure 9:
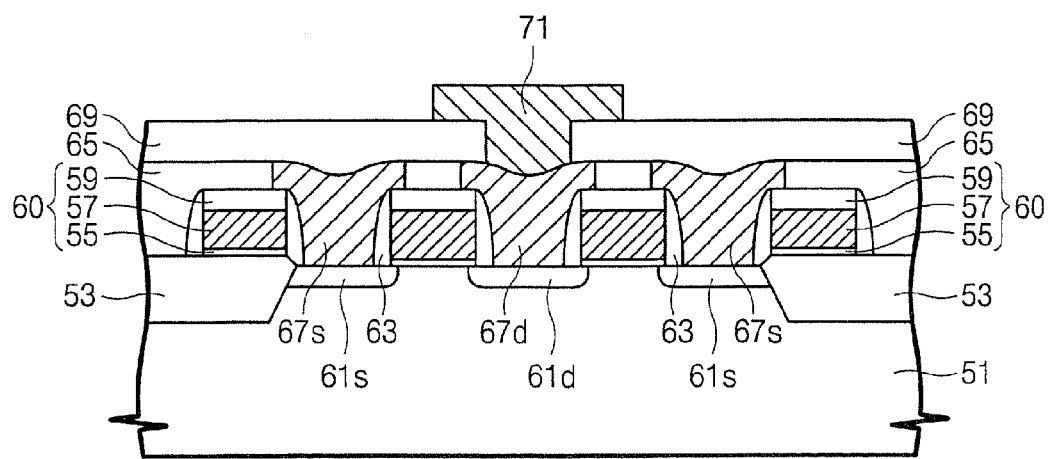

Referring now to FIG. 9, a first lower interlayer insulating layer 65 is formed on the semiconductor substrate. The first lower interlayer insulating layer 65 is patterned to form pad contact holes exposing the source/drain regions 61s and 61d. A conventional technique may be used to form storage node pads 67s and bit line pads 67d in the pad contact holes. The storage node pads 67s are connected to the source regions 61s, and the bit line pad 67d is connected to the common drain region 61d. A second lower interlayer insulating layer 69 is formed on the pads 67s and 67d. The second lower interlayer insulating layer 69 is patterned to form a bit line contact hole (71a shown in FIG. 4) exposing the bit line pad 67d. A bit line 71 is formed, contacting the bit line pad 67d.

Figure 10:
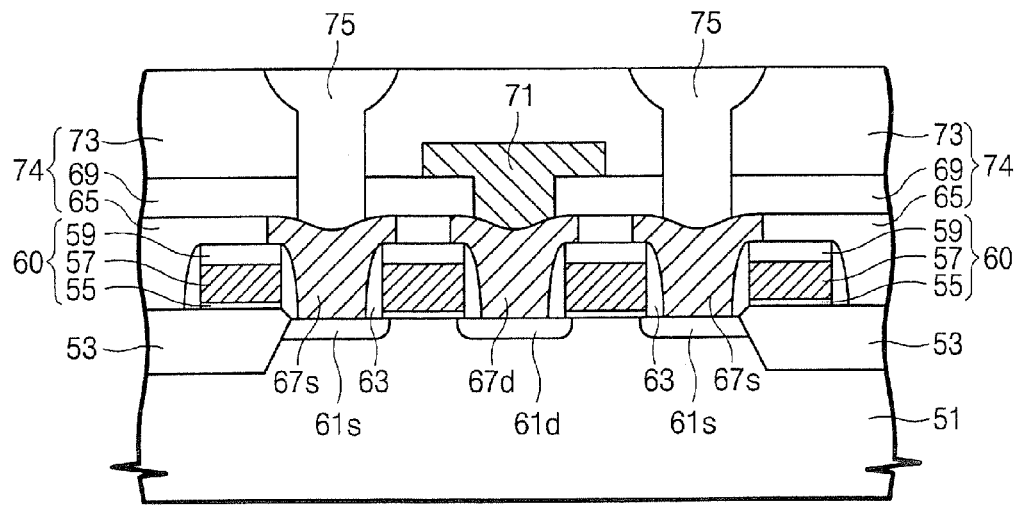

Referring now to FIG. 10, a third lower interlayer insulating layer 73 is formed on the bit line 71. The second and third lower interlayer insulating layers 69 and 73 are patterned to form storage node contact holes (75a shown in FIG. 4) exposing the storage node pads 67s. The storage node contact hole may be formed by a wet and/or dry etch process to increase an upper diameter thereof. Accordingly, an upper sidewall of the storage node contact hole may have a sloped profile, as shown in the drawing. This is aimed at decreasing in an electrical resistance between a lower electrode, formed in a subsequent process, and the source region 61s. Contact plugs 75 are formed in the storage node contact holes.

Figure 11:
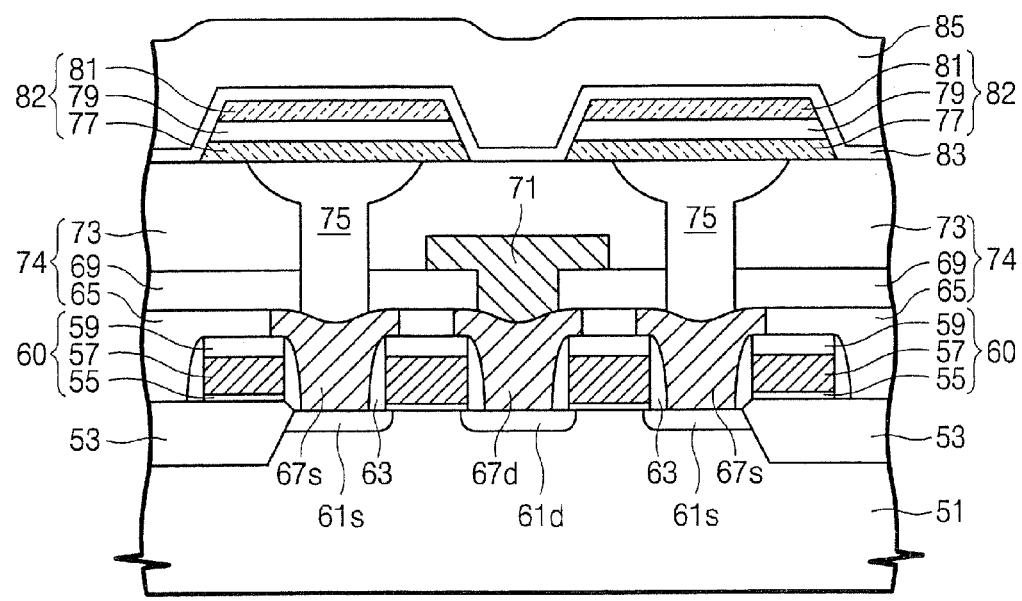

Referring now to FIG. 11, a conductive bottom electrode layer, a ferroelectric layer, and a conductive top electrode layer are sequentially formed on the contact plugs 75 and the lower interlayer insulating layer 74. The top electrode layer, the ferroelectric layer, and the bottom electrode layer are successively patterned to form a plurality of ferroelectric capacitors 82 (CP shown in FIG. 4) that are arrayed along row and column directions. Each of the ferroelectric capacitors 82 includes a bottom electrode 77, a ferroelectric layer pattern 79, and a top electrode 81. Respective ones of the bottom electrodes 77 are in contact with respective ones of the contact plugs 75. Thus, respective ones of the ferroelectric capacitors 82 are electrically connected to respective ones of the source regions 61s. An insulating layer 85 is formed on the resultant structure. Prior to formation of the insulating layer 85, a conformal hydrogen barrier layer 83 may be formed. Preferably, the hydrogen barrier layer 83 is made of titanium oxide ($TiO_2$), aluminum oxide ($Al_2O_3$), silicon nitride ($Si_3N_4$), or combination thereof.

Figure 12:
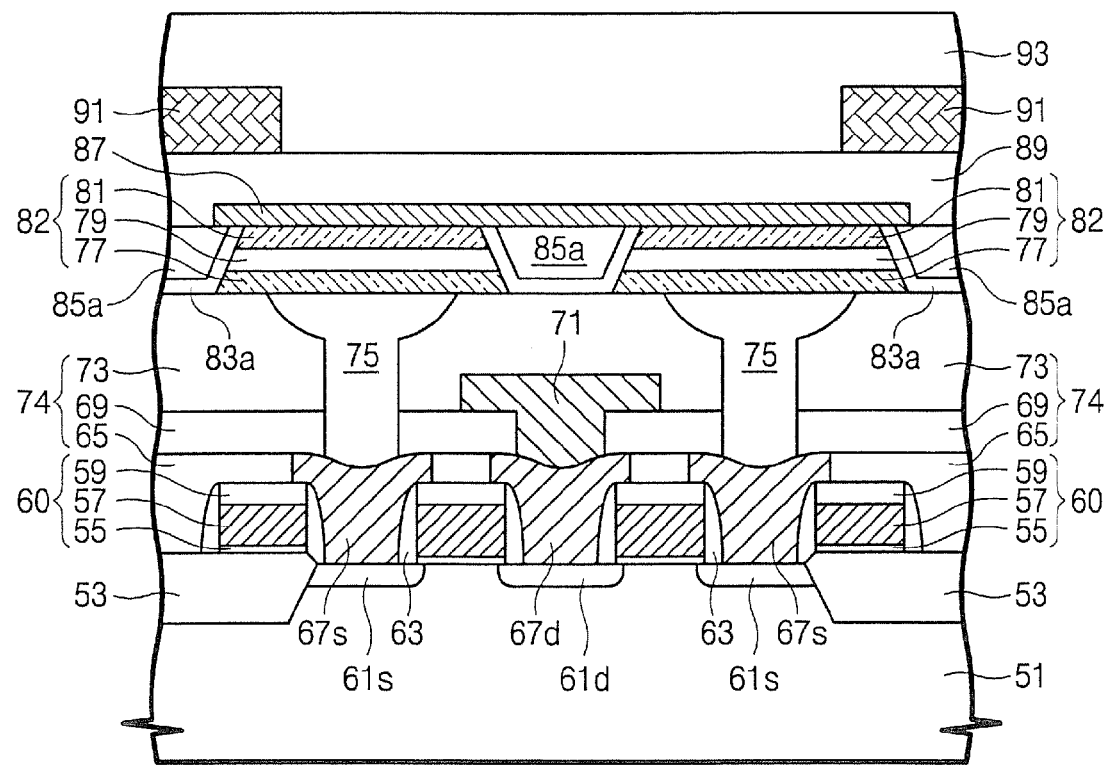

Referring now to FIG. 12, the insulating layer 85 and the hydrogen barrier layer 83 are planarized to expose the top electrodes 81. Thus, a hydrogen barrier layer pattern 83a and an insulating layer pattern 85a are formed between the ferroelectric capacitors 82. The hydrogen barrier layer pattern 83a covers sidewalls of the ferroelectric capacitors 82 (i.e., sidewalls of the ferroelectric layer patterns 79), thereby preventing hydrogen atoms from being injected into the ferroelectric layer patterns 79. If hydrogen atoms are injected into, the ferroelectric layer patterns 79, characteristics of ferroelectric capacitors 82, such as a polarization characteristic or a leakage current characteristic, may be deteriorated. As a result, the hydrogen barrier layer pattern 83a can improve characteristics of the ferroelectric capacitors 82.

A conductive lower plate layer is formed on an entire surface of the semiconductor substrate including the insulating layer pattern 85a. The conductive lower plate layer is patterned to form local plate line 87 (PL shown in FIG. 4) that extends parallel with the word lines 57. The local plate line 87 directly contacts the common electrode 81. An upper interlayer insulating layer is formed on the local plate line 87. The upper interlayer insulating layer is formed by sequentially stacking first and second upper interlayer insulating layers 89 and 93. Prior to formation of the second upper interlayer insulating layer 93, a plurality of parallel main word lines 91 may be formed on the first upper interlayer insulating layer 89. One main word line 91 may control four word lines 57 through a decoder.

Figure 13:
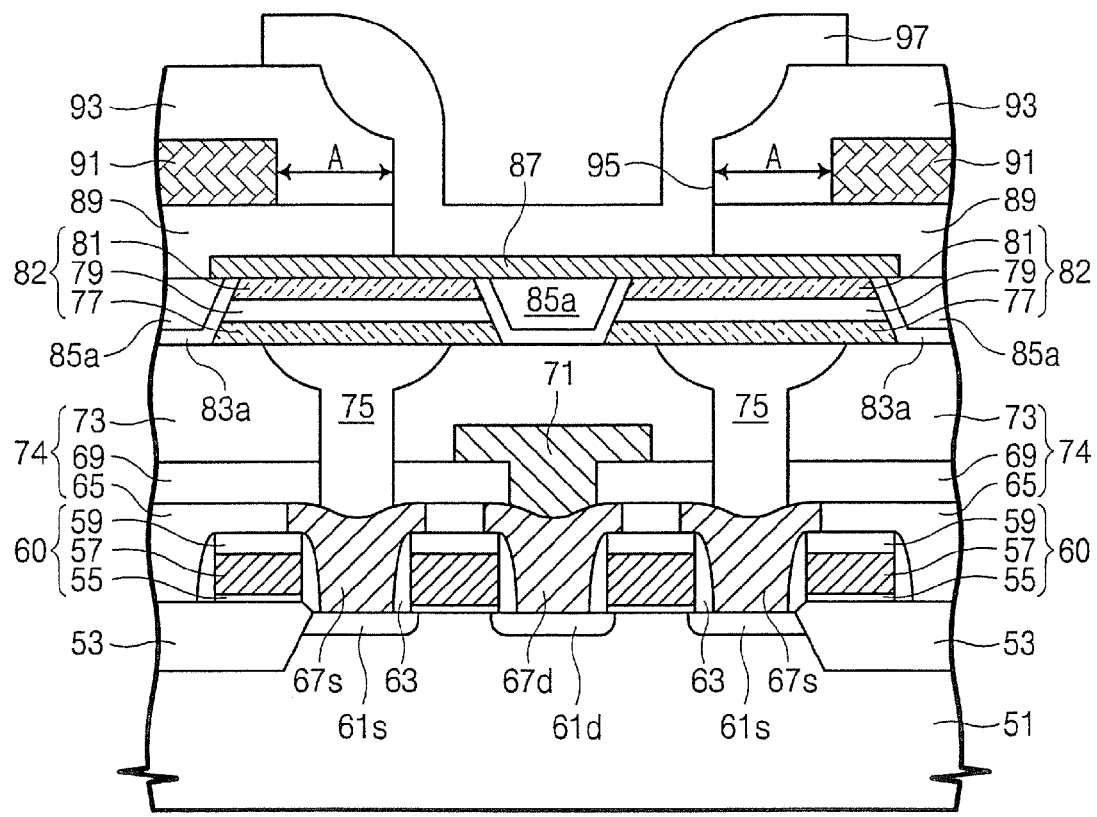

Referring now to FIG. 13, the upper interlayer insulating layer is patterned to form a slit-type via hole 95 exposing the local plate line 87. The slit-type via hole 95 is formed between the main word lines 91, in parallel with the main word lines 91. Compared with a prior art, the slit-type via hole 95 has greater width, as shown in the drawing. Nevertheless, a spacing (A) between the slit-type via hole 95 and the adjacent main word lines 91 can be greater, compared with the prior art. This can lead to a significant decrease in the probability that the word lines 91 will be exposed, even though the slit-type via hole 95 is formed by wet and dry etch in order to lower an aspect ratio thereof.

A conductive upper plate layer, such as a metal layer, is formed on the resultant structure, passing through the slit-type via hole 95 to contact the common top electrode 87. The upper plate layer may exhibit good step coverage because the aspect ratio of the slit-type via hole 95 may be kept relatively low. The upper plate layer is patterned to form a main plate line 97.

Figure 14:
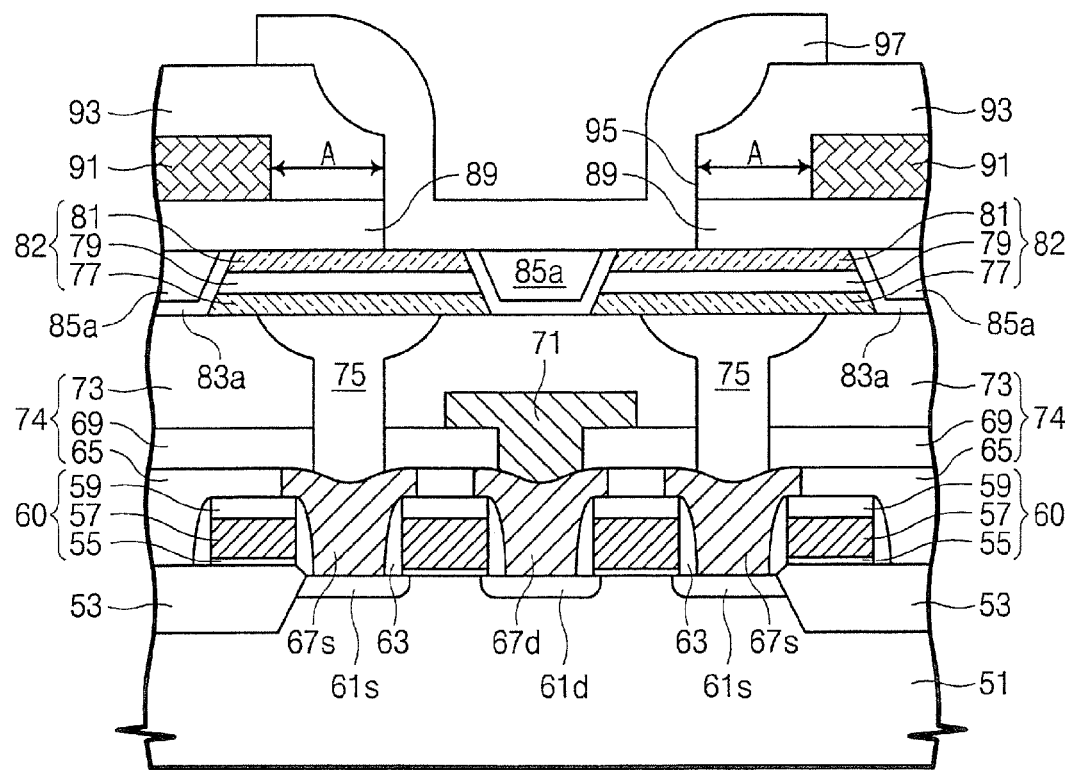

Modifications of the embodiments described in FIGS. 8-13 will now be described with reference to FIG. 14. These modified embodiments differ in the manner in which local plate lines 87 are formed. In the modified embodiments, not only the top electrodes 81, but also the insulating layer pattern 85a therebetween, are exposed during formation of the slit-type via hole 95. Accordingly, the insulating layer pattern 85a is preferably made of material (e.g., silicon nitride) having an etch selectivity with respect to the upper interlayer insulating layer.

Operations for fabricating a ferroelectric memory device according to additional embodiments of the invention will now be described with reference to FIG. 15 through FIG. 19. In these embodiments, cell transistors, a lower interlayer insulating layer, and contact plugs can be formed in the same manner as the embodiments described in FIGS. 8-13.

Figure 15:
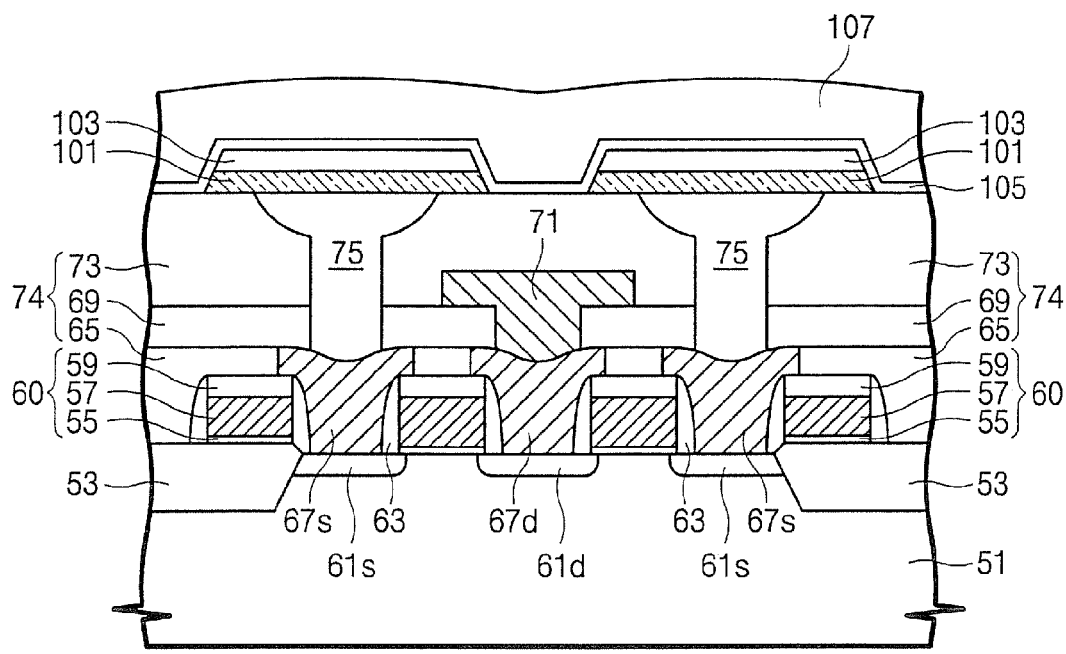
FIGS. 15-19 are cross-sectional views of intermediate fabrication products illustrating operations for fabricating a ferroelectric memory device according to other embodiments of the present invention.

Referring now to FIG. 15, a conductive bottom electrode layer and a ferroelectric layer are sequentially formed on the lower interlayer insulating layer 74 and the contact plugs 75. The ferroelectric layer and the bottom electrode layer are successively patterned to form a plurality of bottom electrodes 101 covering the contact plugs 75, and a plurality of ferroelectric layer patterns 103 stacked on the bottom electrodes 101. A hydrogen barrier layer 105 and a lower insulating layer 107 are sequentially formed on the ferroelectric layer patterns 103.

Figure 16:
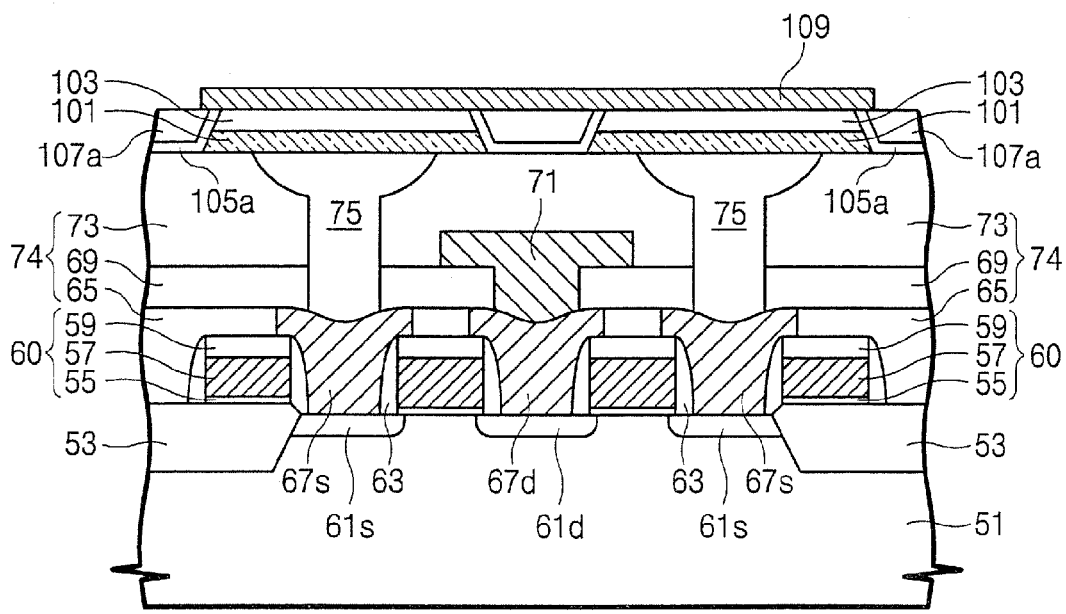

Referring now to FIG. 16, the lower insulating layer 107 and the hydrogen barrier layer 105 are planarized to expose the ferroelectric layer patterns 103. Thus, a lower insulating layer pattern 107a and a hydrogen barrier layer pattern 105a are formed in gaps between the ferroelectric layer patterns 103 and between the bottom electrodes 101. A conductive top electrode layer is formed on the lower insulating layer pattern 107a, the hydrogen barrier layer pattern 105a, and the ferroelectric layer patterns 103. The top electrode layer is patterned to form a common top electrode 109 that extends parallel to the word lines 57. The common top electrode 109 covers the ferroelectric layer patterns 103.

Figure 17:
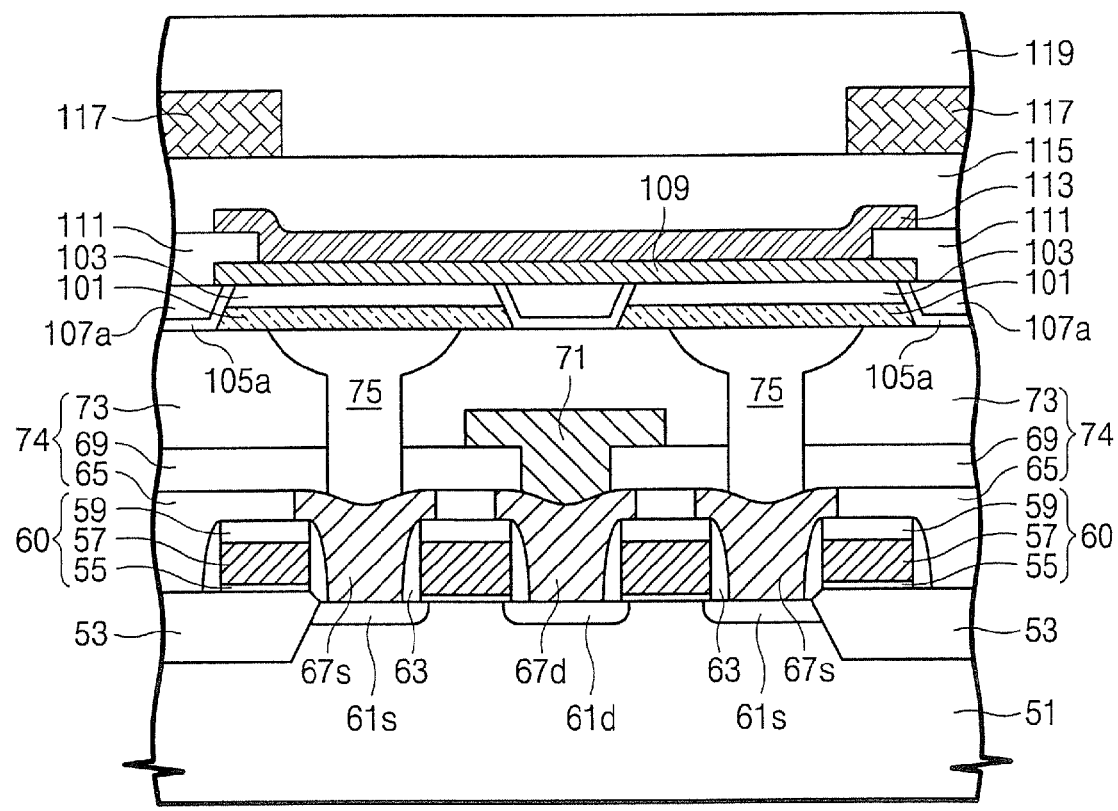
Figure 18:
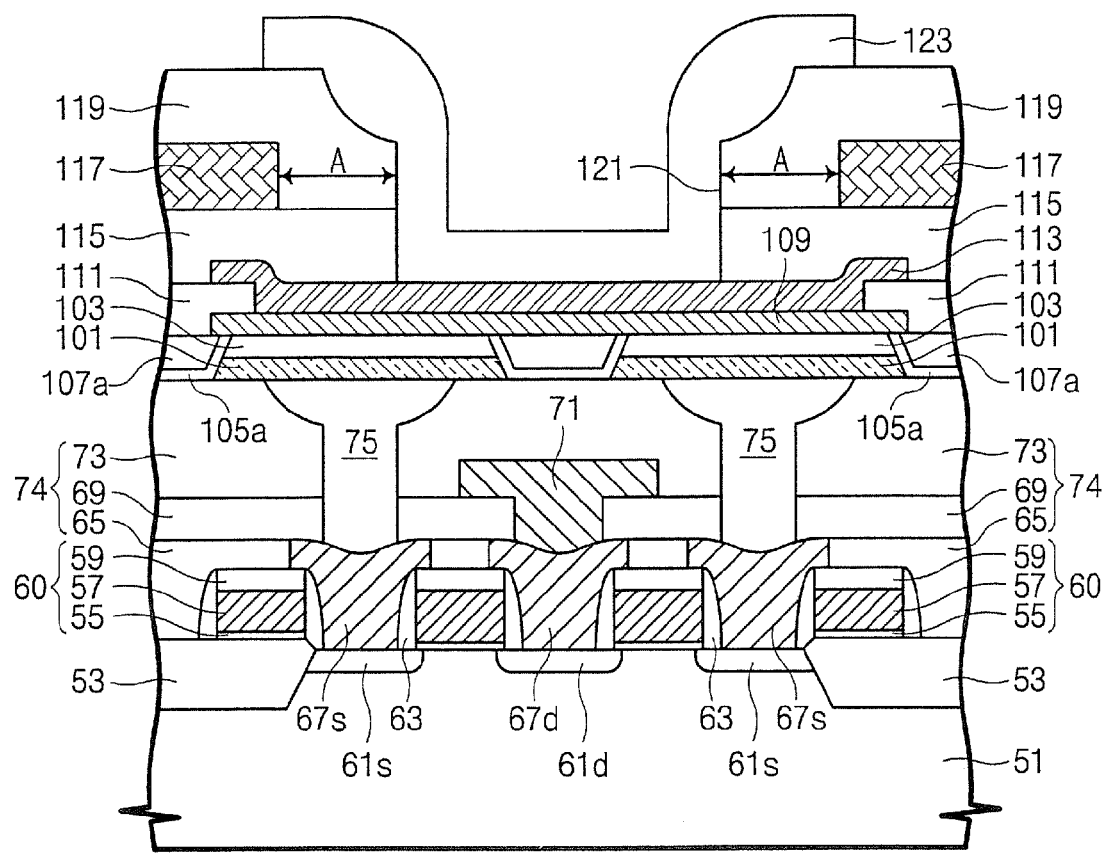

Referring now to FIG. 17, an upper insulating layer 111 is formed on the common top electrode 109. The upper insulating layer 111 is patterned to form a slit-type contact hole exposing the common top electrode 109. A conductive lower plate layer is formed, contacting the common top electrode 109 through the slit-type contact hole. The lower plate layer is patterned to form a local plate line 113 (PL shown in FIG. 4). First and second upper interlayer insulating layers 113 and 119 are sequentially formed on the local plate line. A plurality of main word lines 117 may be formed between the first and second interlayer insulating layers 113 and 119. The main word lines 117 are formed in the same manner as in the previously described embodiments. Referring to FIG. 18, a slit-type via hole 121 is formed in the upper interlayer insulating layer. A main plate line 123 is then formed as previously described.

Figure 19:
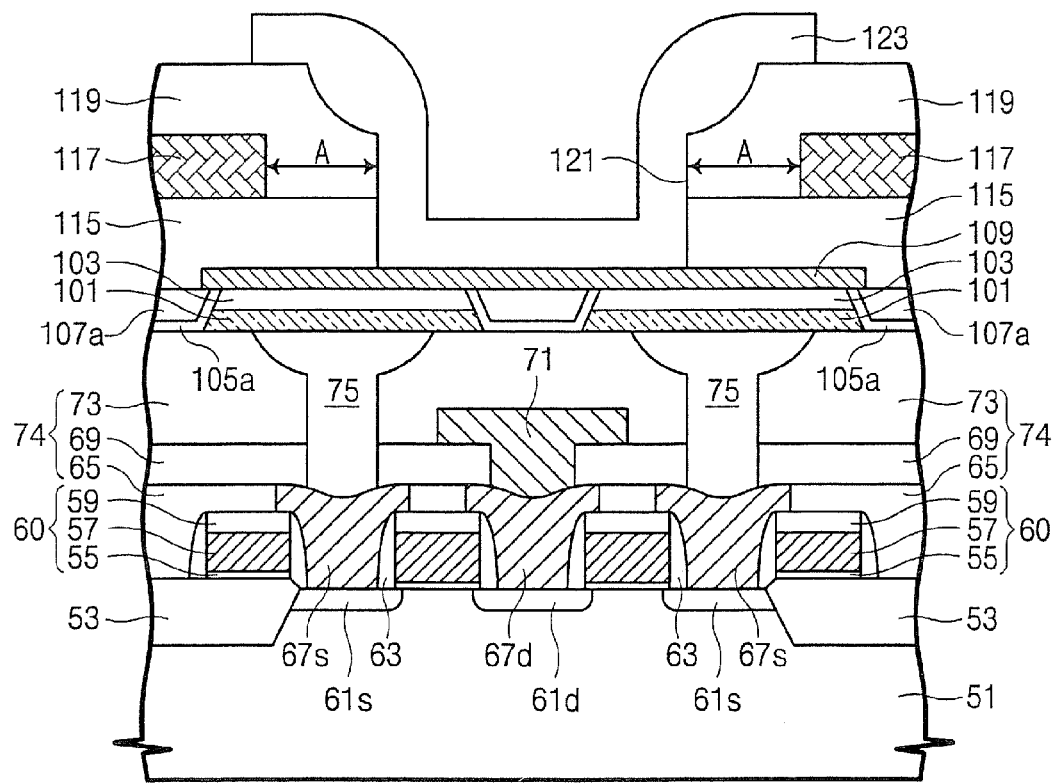

Modifications of the embodiments described in FIGS. 15-18 will now be described with reference to FIG. 19. The modified embodiments are identical to the embodiments of FIGS. 15-18, except that the local plate line 115 is not formed. In this case, the slit-type via hole 121 exposes the common top electrode 109.

A method of fabricating a ferroelectric memory device according to further embodiments of the invention will now be described with reference to FIG. 20 through FIG. 24. In these embodiments, cell transistors, a lower interlayer insulating layer, and contact plugs are formed in the same manner as in the previously described embodiments.

Figure 20:
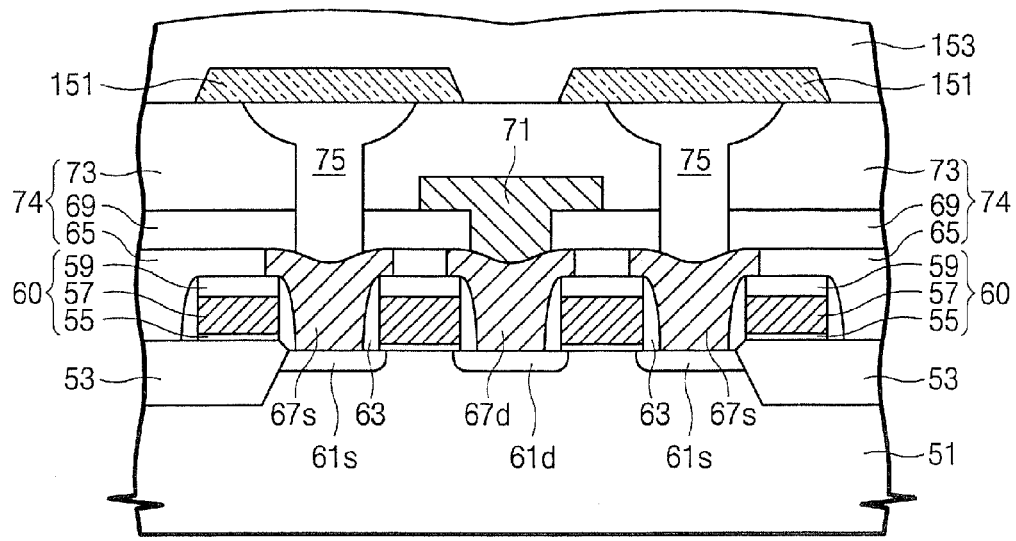
FIGS. 20-26 are cross-sectional views of intermediate fabrication products illustrating operations for fabricating a ferroelectric memory device according to farther embodiments of the present invention.

Referring now to FIG. 20, a conductive bottom electrode layer is formed on the lower interlayer insulating layer 74 and the contact plugs 75. The bottom electrode layer is patterned to form a plurality of bottom electrodes 151 covering the contact plugs 75. A lower insulating layer 153 is formed on the bottom electrodes 151.

Figure 21:
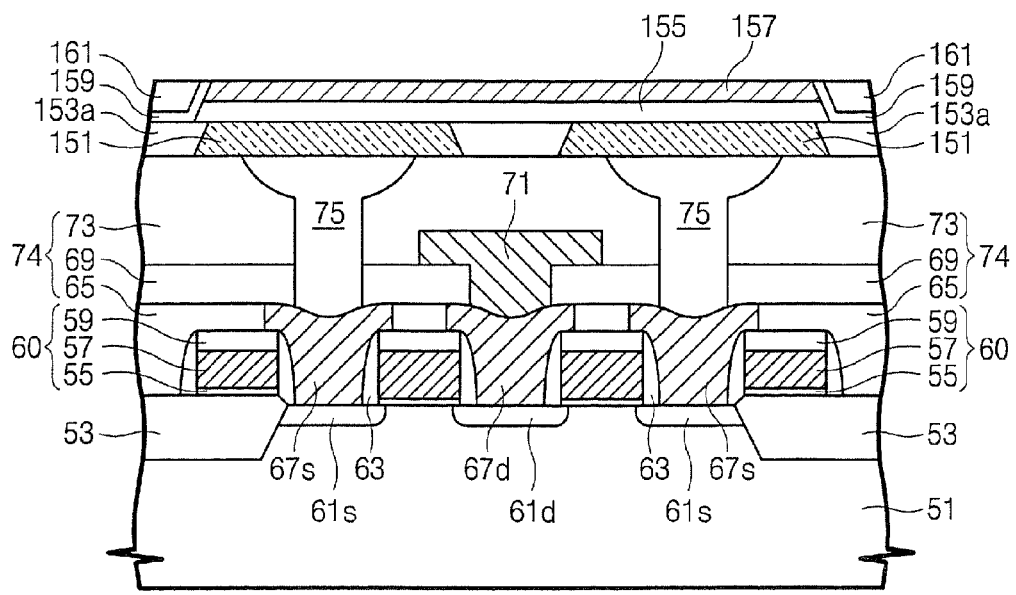

Referring now to FIG. 21, the lower insulating layer 153 is planarized to expose upper surfaces of the bottom electrodes 151, thus forming an insulating layer pattern 153a in a gap between the bottom electrodes 151. A ferroelectric layer and a conductive top electrode layer are sequentially formed on the lower insulating layer pattern 153a and the bottom electrodes 151. The upper electrode layer and the ferroelectric layer are successively patterned to form a common ferroelectric layer pattern 155 and a common top electrode 157. The common ferroelectric layer pattern 155 covers the adjacent bottom electrodes 151. A hydrogen barrier layer pattern 159 and an upper insulating layer pattern 161 are formed in gaps adjacent the common ferroelectric pattern 155 and the common top electrode 157.

Figure 22:
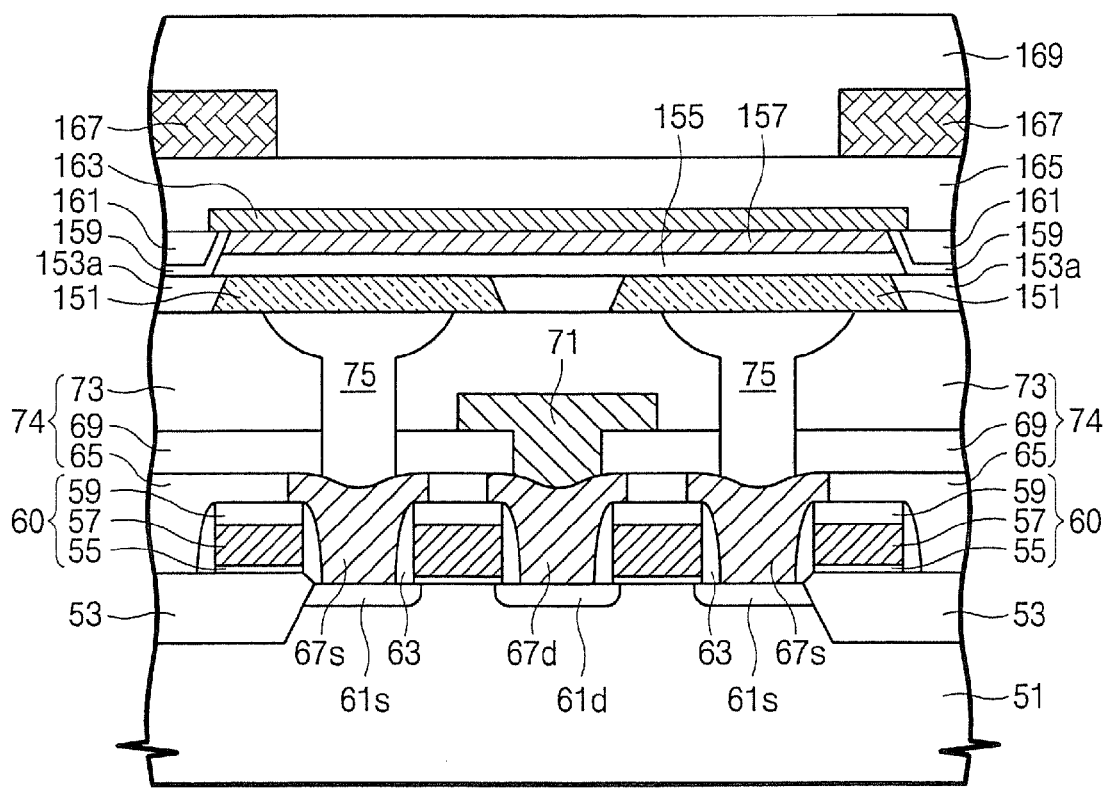

Referring now to FIG. 22, a conductive lower plate layer is formed on the upper insulating layer pattern 161. The lower plate layer is patterned to form a local plate line 163 (PL shown in FIG. 4) covering the common top electrode 163. An upper interlayer insulating layer is formed on the local plate line 163. The upper interlayer insulating layer is formed by sequentially stacking first and second upper interlayer insulating layers 165 and 169. A plurality of parallel main word lines 167 may be formed between the first and second upper interlayer insulating layers 165 and 169. The main word lines 167 may be formed as in previously described embodiments.

Figure 23:
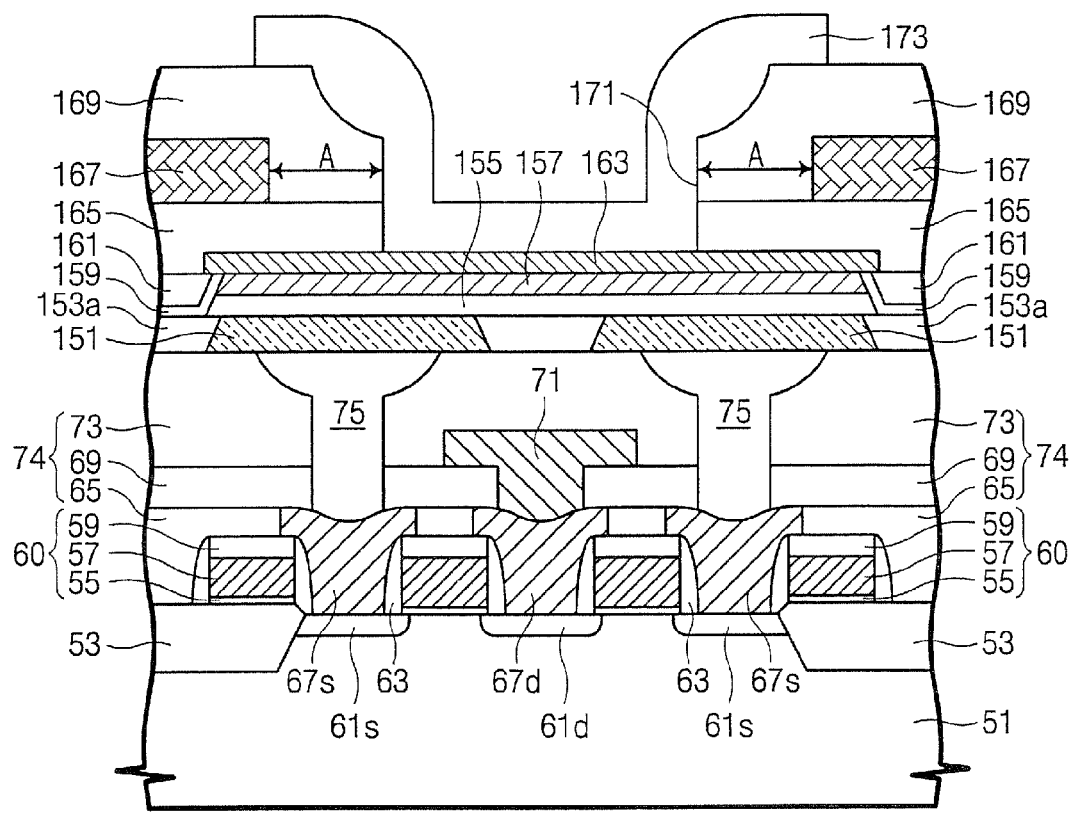

Referring now to FIG. 23, a slit-type via hole 171 is formed in the upper interlayer insulating layer. A conductive main plate line 173 is formed, extending through the slit-type via hole 171. The slit-type via hole 171 and the main plate line 173 may be formed as in the previously described embodiments.

Figure 24:
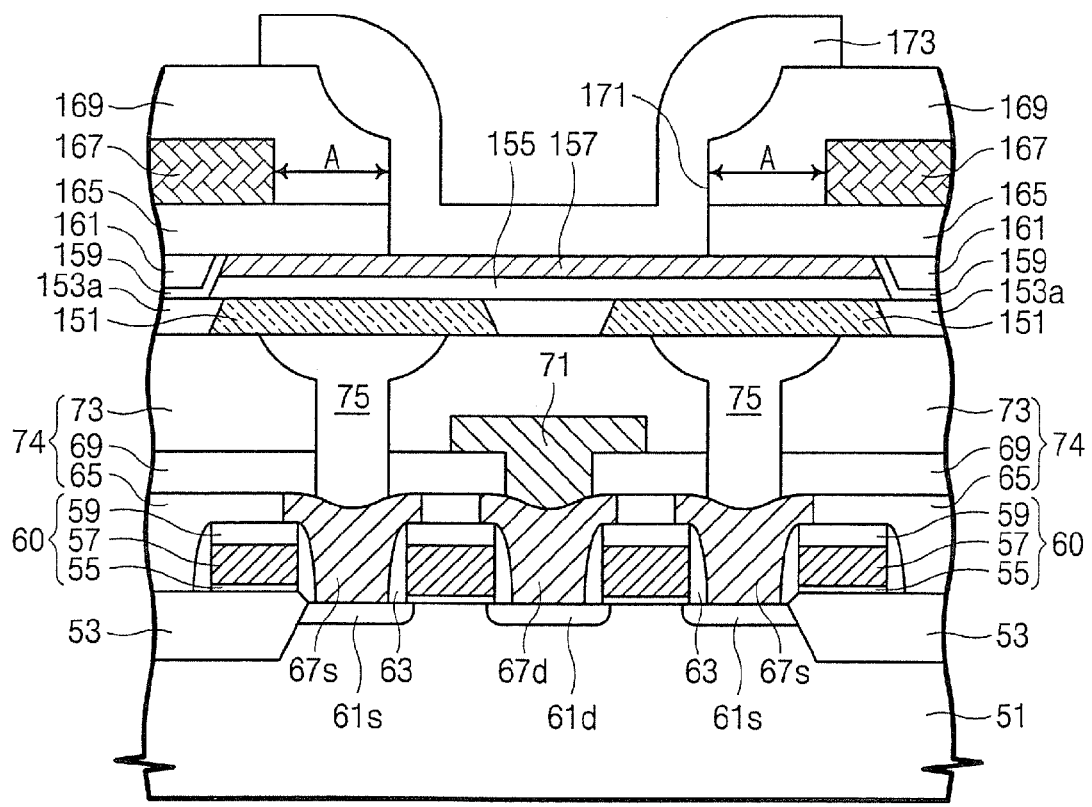
Figure 25:
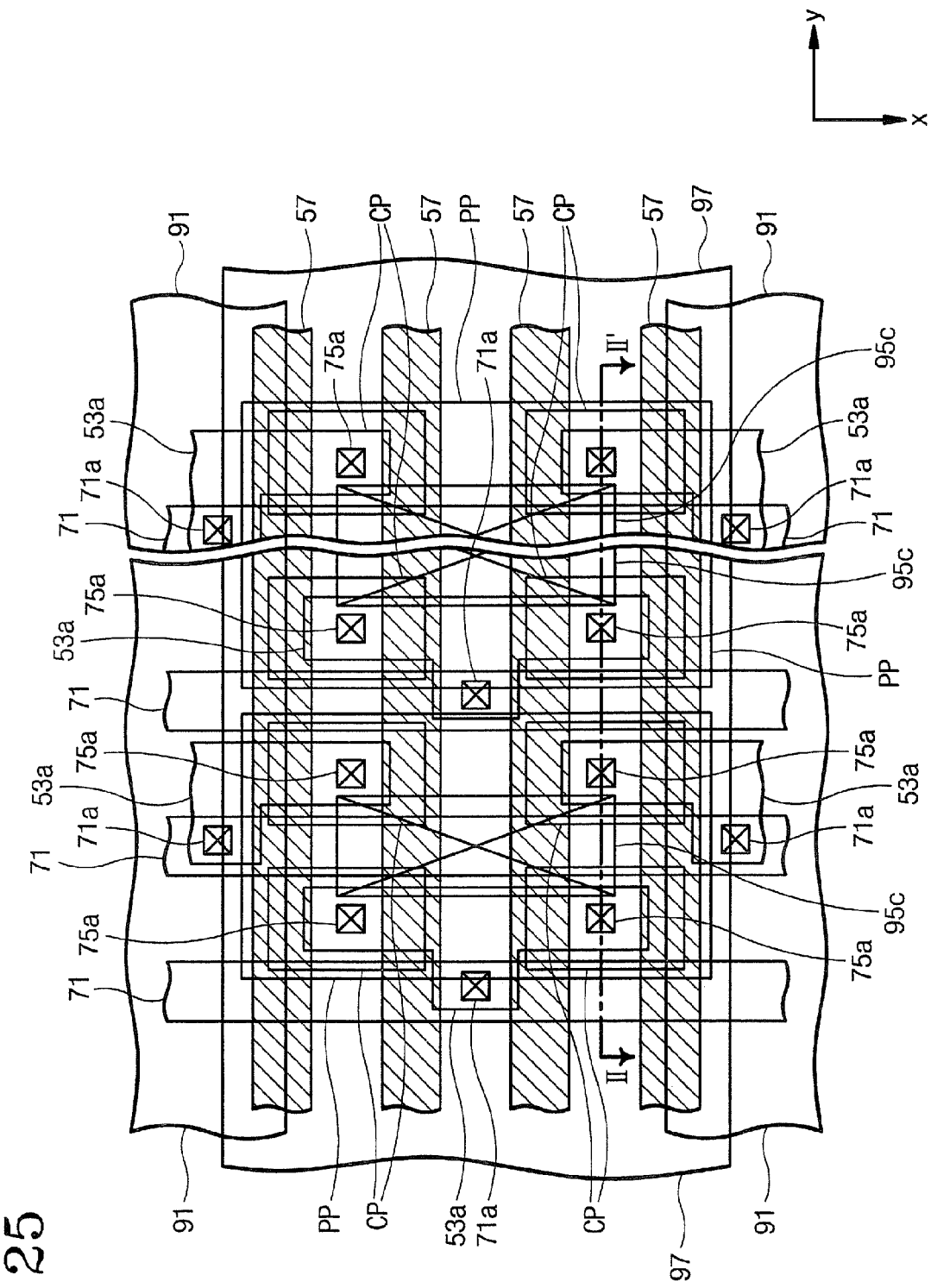
Figure 26:
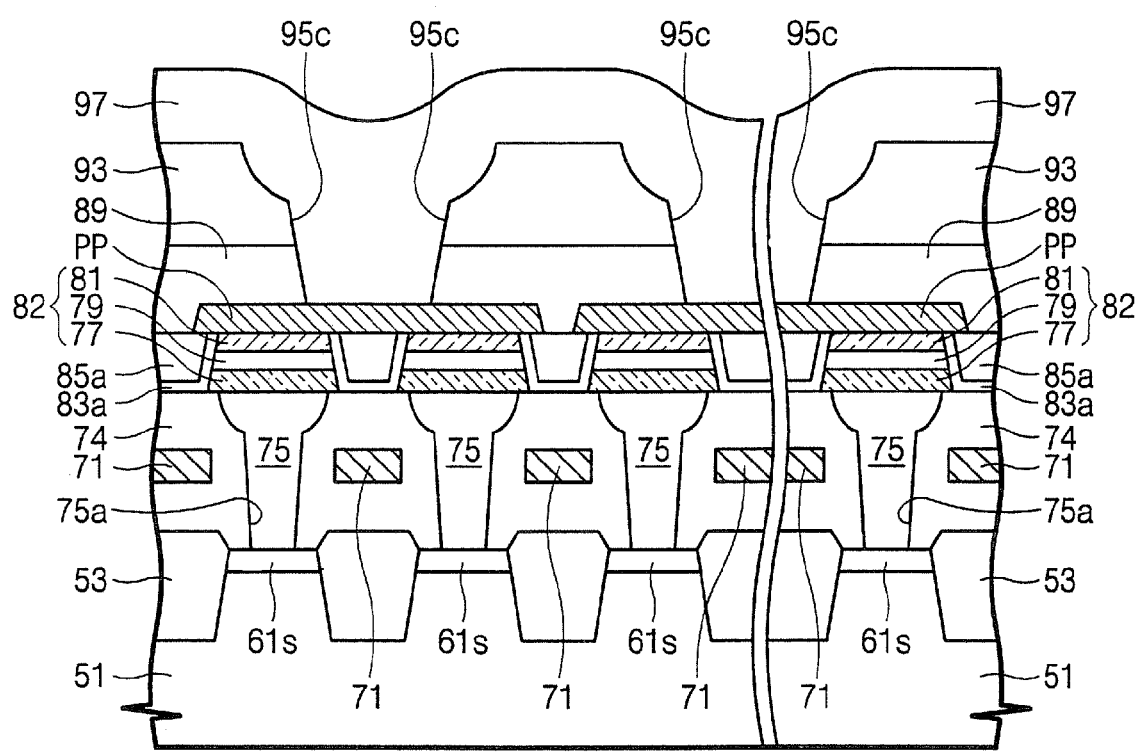

A modification of the embodiments of FIGS. 20-23 will now be described with reference to FIG. 24. The modified embodiments are identical to the embodiments of FIGS. 20-23 except that the local plate line 163 is omitted. In this case, the slit-type via hole 171 exposes the common top electrode 157.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A memory device comprising:
   a plurality of word lines on a substrate and extending lengthwise along a row direction;
   a plurality of ferroelectric capacitors on the substrate, each of the ferroelectric capacitors comprising a bottom electrode, a ferroelectric layer and a top electrode, a level of the bottom electrode lower than a level of the top electrode; and
   a plate line extending lengthwise along the row direction on the ferroelectric capacitors connected to at least two of the plurality of ferroelectric capacitors arranged along a column direction and overlapping two adjacent ones of the word lines, wherein the plate line comprises a main plate and further comprising a local plate line arranged along the row direction and electrically connected to the main plate line, wherein the local plate line is between the main plate line and the at least two of the plurality of ferroelectric capacitors, and wherein the local plate line is electrically connected to the at least two of the plurality of ferroelectric capacitors.

2. The memory device of claim 1, wherein the local plate line is further electrically connected to at least two of the plurality of ferroelectric capacitors arranged along the row direction.

3. The memory device of claim 1, further comprising a main word line, wherein a level of the main word line is higher than a level of the ferroelectric capacitors, and wherein the level of the main word line is between a level of the main plate line and a level of the local plate line.

4. The memory device of claim 3, wherein the main word line controls four adjacent word lines.

5. The memory device of claim 3, further comprising a plurality of bit lines on the substrate and extending along the column direction, wherein a level of the word lines is lower than the level of the ferroelectric capacitors, and wherein a level of the bit lines is between the level of the word lines and the level of the ferroelectric capacitors.

6. The memory device of claim 1, wherein the local plate line overlaps four adjacent ones of the word lines.

7. A memory device comprising:
   a plurality of word lines on a substrate and extending lengthwise along a row direction;
   a plurality of ferroelectric capacitors on the substrate, each of the ferroelectric capacitors comprising a bottom electrode, a ferroelectric layer and a top electrode, a level of the bottom electrode lower than a level of the top electrode; and
   a plate line extending lengthwise along the row direction on the ferroelectric capacitors connected to at least two of the plurality of ferroelectric capacitors arranged along a column direction and overlapping two adjacent ones of the word lines, wherein at least two adjacent top electrodes arranged along the column direction and at least two adjacent top electrodes arranged along the row direction are connected each other to form a common top electrode.

8. A memory device, comprising:
   a transistor on a substrate;
   a bit line electrically connected to a first impurity diffusion region of the transistor;
   a ferroelectric capacitor electrically connected to a second impurity diffusion region of the transistor, each of the ferroelectric capacitors comprising a bottom electrode electrically connected to the second impurity diffusion region, a ferroelectric layer and a top electrode, a level of the bottom electrode lower than a level of the top electrode;
   a first metal layer electrically connected to the ferroelectric capacitor; and
   a second metal layer controlling a gate of the transistor,
   wherein a level of the second metal layer is lower than a level of the first metal layer.

9. A memory device, comprising:
   a transistor on a substrate;
   a bit line electrically connected to a first impurity diffusion region of the transistor;
   a ferroelectric capacitor electrically connected to a second impurity diffusion region of the transistor, each of the ferroelectric capacitors comprising a bottom electrode electrically connected to the second impurity diffusion region, a ferroelectric layer and a top electrode, a level of the bottom electrode lower than a level of the top electrode;
   a first metal layer electrically connected to the ferroelectric capacitor; and
   a second metal layer controlling a gate of the transistor,
   further comprising a third metal layer configured to electrically connect the first metal layer to the ferroelectric capacitor, wherein a level of the third metal layer is between a level of the first metal layer and a level of the second metal layer.

10. The memory device of claim 9, wherein the ferroelectric capacitor is one of a plurality of ferroelectric capacitors arranged in row and column directions, and wherein the first metal layer is electrically connected to at least two ferroelectric capacitors arranged along the column direction through the third metal layer.

11. The memory device of claim 10, further comprising a hydrogen barrier layer, wherein the ferroelectric capacitor comprises a bottom electrode, a ferroelectric layer on a top surface of the bottom electrode, and a top electrode on a top surface of the ferroelectric layer, and wherein the hydrogen barrier layer covers at least side surfaces of the ferroelectric layer such that the ferroelectric layer is encapsulated by a composite layer of the bottom electrode, the hydrogen barrier layer and the top electrode.

12. The memory device of claim 9, wherein the ferroelectric capacitor is one of a plurality of ferroelectric capacitors arranged in row and column directions, and wherein the first metal layer is electrically connected to at least two ferroelectric capacitors arranged along the column direction.

* * * * *